United States Patent
Cagdaser et al.

(10) Patent No.: US 10,001,387 B2
(45) Date of Patent: Jun. 19, 2018

(54) MODE-TUNING SENSE INTERFACE

(71) Applicant: Invensense, Inc., San Jose, CA (US)

(72) Inventors: Baris Cagdaser, Sunnyvale, CA (US); Derek Shaeffer, Redwood City, CA (US); Joseph Seeger, Menlo Park, CA (US)

(73) Assignee: Invensense, Inc., San Jose, CA (US)

( * ) Notice: Subject to any disclaimer, the term of this patent is extended or adjusted under 35 U.S.C. 154(b) by 147 days.

(21) Appl. No.: 15/058,084

(22) Filed: Mar. 1, 2016

(65) Prior Publication Data

US 2016/0178393 A1    Jun. 23, 2016

Related U.S. Application Data

(62) Division of application No. 13/720,984, filed on Dec. 19, 2012, now Pat. No. 9,304,155.

(51) Int. Cl.
G01C 25/00 (2006.01)
G01R 27/26 (2006.01)
G01C 19/5726 (2012.01)
G01D 5/24 (2006.01)

(52) U.S. Cl.
CPC ......... *G01C 25/00* (2013.01); *G01C 19/5726* (2013.01); *G01R 27/2605* (2013.01); *G01D 5/24* (2013.01)

(58) Field of Classification Search
CPC .... G01C 25/00; G01C 25/05; G01C 19/5726; G01R 27/2605; G01D 5/24; G01D 5/241; G01D 5/2417

USPC ........... 73/1.37, 1.38, 1.41, 1.59–1.62, 1.75, 73/1.77–1.82, 1.85, 32 A, 651–657, 73/861.18, 861.354–861.357,
(Continued)

(56) References Cited

U.S. PATENT DOCUMENTS

| 2,243,749 A * | 5/1941 | Clewell ............... G01V 7/00 73/382 R |
| 6,744,264 B2 | 6/2004 | Gogoi et al. |
| 7,155,979 B2 | 1/2007 | Lasalandra et al. |

(Continued)

OTHER PUBLICATIONS

Joseph L Seeger and Bernhard E. Boser, "Charge Control of Parallel-Plate Electrostatic Actuators and the Tip-In Instability", Journal of Microelectromechanical Systems, vol. 12, No. 5, Oct. 2003.

*Primary Examiner* — Robert R Raevis
(74) *Attorney, Agent, or Firm* — Fountainhead Law Group P.C.

(57) ABSTRACT

A MEMS capacitive sensing interface includes a sense capacitor having a first terminal and a second terminal, and having associated therewith a first electrostatic force. Further included in the MEMS capacitive sensing interface is a feedback capacitor having a third terminal and a fourth terminal, the feedback capacitor having associated therewith a second electrostatic force. The second and the fourth terminals are coupled to a common mass, and a net electrostatic force includes the first and second electrostatic forces acting on the common mass. Further, a capacitance measurement circuit measures the sense capacitance and couples the first terminal and the third terminal. The capacitance measurement circuit, the sense capacitor, and the feedback capacitor define a feedback loop that substantially eliminates dependence of the net electrostatic force on a position of the common mass.

5 Claims, 4 Drawing Sheets

(58) Field of Classification Search
USPC ............... 73/504.02–504.16, 514.15–514.17,
73/514.26, 514.27, 514.29, 723–728
See application file for complete search history.

(56) References Cited

U.S. PATENT DOCUMENTS

| | | |
|---|---|---|
| 2006/0049836 A1 | 3/2006 | Morimoto et al. |
| 2006/0126455 A1 | 6/2006 | Ikeda |
| 2008/0236280 A1* | 10/2008 | Johnson ............. G01C 19/5719 73/504.14 |
| 2009/0019933 A1 | 1/2009 | Sung et al. |
| 2009/0223277 A1* | 9/2009 | Rudolf ................... G01C 19/56 73/1.37 |
| 2012/0105080 A1 | 5/2012 | Iwasawa et al. |

* cited by examiner

MODE-TUNING SENSE INTERFACE

RELATED APPLICATIONS

This patent application is a divisional application of U.S. patent application Ser. No. 13/720,984, filed on Dec. 19, 2012, by Buis Cagdaser, et al., and entitled, "MODE-TUNNING SENSE INTERFACE", the disclosures of which are incorporated herein, in their entirety, by reference.

BACKGROUND

Capacitive position sensing is a common means of detecting displacement in MEMS transducers.

Mechanical parameters of a MEMS device generally determine essential aspects of the transducer design such as sensitivity, noise performance, and MEMS dynamics (resonance frequency, quality factor, settling time etc.). For instance, the mass and the spring of a MEMS device determine the resonance frequency in accordance with the following relationship:

$$f_{res} = \sqrt{\frac{k_x}{m}}, \quad \text{Eq. (1)}$$

Where $k_x$ represents the spring, $f_{res}$ represents the resonant frequency and m represents the mass. The damping, b, determines the Brownian noise force as follows:

$$F_B = \sqrt{4k_BTb}, \quad \text{Eq. (2)}$$

and all three determine the quality factor of the MEMS system, as follows:

$$Q = \frac{\sqrt{k_x m}}{b}. \quad \text{Eq. (3)}$$

Often, MEMS dynamics are also influenced by factors other than mechanical parameters. For example, a parallel-plate sense capacitor can undesirably introduce electrostatic spring softening. Such a device is often unavoidable especially when MEMS motion is perpendicular to the device layer that the MEMS device is built in. The impact of spring softening can be modeled by an additional spring ($k_v$) acting on the mass. The electrostatic spring constant $k_v$ is determined by the second derivative of the sense capacitance with respect to the position and the high-voltage bias ($V_b$) as follows:

$$k_v = -\frac{1}{2}\frac{d^2C_s}{dx^2}V_b^2. \quad \text{Eq. (4)}$$

In the presence of spring softening, the resonance frequency of the MEMS system is determined by the sum of all springs acting on the mass, as follows:

$$f_{res} = \sqrt{\frac{k_x + k_v}{m}}. \quad \text{Eq. (5)}$$

As the bias voltage increases or the parallel-plate gap decreases, spring softening can result in a net negative spring constant causing instability also known as the "pull-in." At smaller degrees, spring softening can introduce significant variations to resonance frequency and transducer sensitivity. Thus, stability of high-voltage bias and the parallel-plate sense capacitor's gap can become particularly important since they can introduce temperature and package dependence to the transducer via spring softening.

In some prior art techniques, spring softening is avoided in parallel-plate actuators by maintaining a constant charge on the actuator capacitor. In a constant charge actuator, displacement is controlled by the amount of charge stored on the actuator capacitor instead of the voltage difference applied across its terminals. The drive circuit controls the amount of charge flow to the actuator capacitor. Thus, the voltage across the actuator capacitor is free to fluctuate in response to actuator displacements. Such operation, also known as the "charge control", eliminates position dependence of electrostatic force, and, hence, the spring-softening in parallel-plate actuators.

In contrast to the charge controlled actuator, capacitive sensing often results in charge transfer between the sense capacitor and the capacitance measurement circuit. In a traditional trans-capacitance implementation, the capacitance measurement circuit uses a known capacitance $C_{fb}$ to convert this charge reading into an output voltage. This scheme however, results in an unwanted position-dependent force and introduces spring softening in the sense capacitor.

There is thus a need for a MEMS capacitive sensing interface with reduced electrostatic spring softening effect.

SUMMARY

Briefly, an embodiment of the invention includes a MEMS capacitive sensing interface that has a sense capacitor. The sense capacitor has a first terminal and a second terminal and has associated therewith a first electrostatic force. Further included in the MEMS capacitive sensing interface is a feedback capacitor having a third terminal and a fourth terminal, the feedback capacitor having associated therewith a second electrostatic force. The second and the fourth terminals are coupled to a common mass, and a net electrostatic force includes the first and second electrostatic forces acting on the common mass. Further, a capacitance measurement circuit measures the sense capacitance and couples the first terminal and the third terminal. The capacitance measurement circuit, the sense capacitor, and the feedback capacitor define a feedback loop that substantially eliminates dependence of the net electrostatic force on a position of the common mass.

A further understanding of the nature and the advantages of particular embodiments disclosed herein may be realized by reference of the remaining portions of the specification and the attached drawings.

DETAILED DESCRIPTION OF EMBODIMENTS

The following describes a MEMS capacitive sensing interface used to measure the displacement of a MEMS device while reducing the effect of electrostatic spring softening. In one embodiment of the invention, the MEMS capacitive sensing interface has a feedback loop comprising a sense capacitor, a feedback capacitor, and a capacitance measurement circuit, all of which are used to substantially eliminate dependence of the net electrostatic force on the position of the MEMS device. In other embodiments and methods of the invention, a resonance frequency of the MEMS device is tuned, allowing for tuning of the mechanical resonance modes.

Figure 1A:
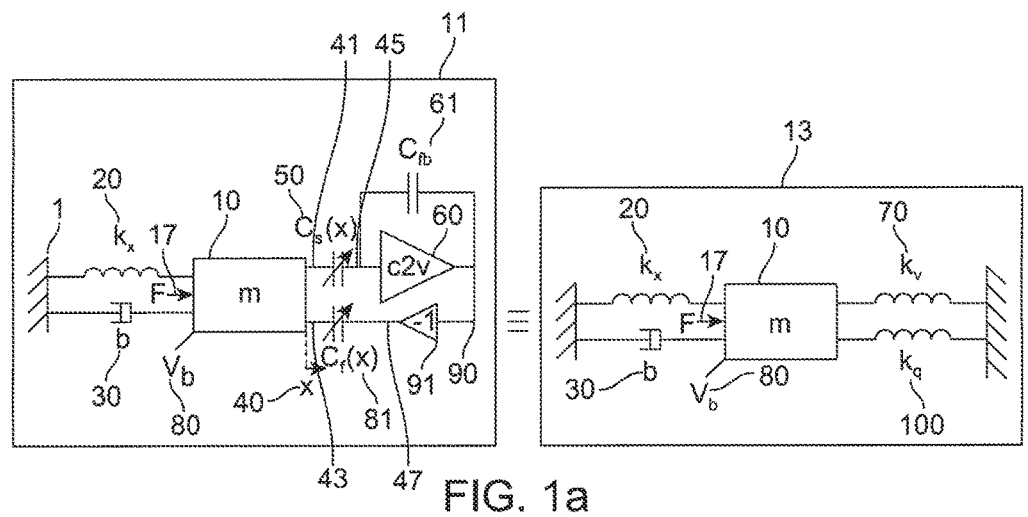
FIG. 1a shows a conceptual block diagram of a MEMS capacitive sensing interface 11, in accordance with an embodiment of the invention.

Referring now to FIG. 1a, a conceptual block diagram of a MEMS capacitive sensing interface 11 is shown, in accordance with an embodiment of the invention. The interface 11 is shown to include a MEMS device modeled as a common mass (m) 10, a spring ($k_x$) 20, and a damper (b) 30. For example, this model may represent one of an accelerometer, gyroscope, compass, microphone or other MEMS device known in the art. The damper in the model represents the effect of various energy loss mechanisms (such as air damping) on the behavior of the MEMS device. The interface 11 is further shown to include a sense capacitor ($C_s(x)$) 50, a feedback capacitor ($C_f(x)$) 81, and a capacitance measurement circuit comprising an amplifier 60, a feedback capacitor ($C_{fb}$) 61, and a sign inverter 91. A feedback loop comprises the capacitive measurement circuit 60, the sense capacitor 50, and the feedback capacitor 61.

The common mass 10 is shown to be flexibly attached to a fixed structure 1 through the spring 20 and the damper 30. A force 17 is applied to the common mass 10. The common mass, 10, is shown to have two terminals, one such terminal is shown connected the common mass through a terminal 41 of the sense capacitor 50 and another such terminal is shown connected to the common mass 10 through a terminal 43 of the capacitor 81.

Another terminal of the sense capacitor 50, namely terminal 45, is shown coupled to the amplifier 60 and the feedback capacitor 61. The feedback capacitor 61 is shown coupled at another terminal to the output of the amplifier 60, which is also shown coupled to the input of the inverter 91. The output of the inverter 91 is shown coupled to the terminal 47 that serves as one of the terminals of the capacitor 81.

In the MEMS interface 11, an input force F 17 is applied to the common mass 10. The resulting displacement of the mass, x 40, is sensed by measuring a corresponding change in sense capacitance $C_s$ 50. A high voltage bias ($V_b$) 80 is applied to the common mass 10. In an exemplary embodiment, the voltage 80 is in the range of 25V. The use of high voltage biasing improves the sensitivity of the MEMS in that more output charge flows through capacitor $C_s$ (50) in response to a given displacement 40. However, the use of high voltage bias 80 also produces a first electrostatic force in capacitor $C_s$ 50 acting on the common mass 10. This force is position dependent and acts like a negative spring constant for small displacements. This negative spring constant is undesirable in that it modifies the dynamics of the MEMS interface. A second capacitor, $C_f$ 81, is also biased with high voltage bias 80 and therefore has associated with it a second position-dependent electrostatic force acting on the common-mass 10. However, driving terminal 47 of capacitor $C_f$ 81 with a signal proportional to the measured change in position 40 modifies the second force such that the position dependence of the net force (the sum of the first and second forces) is substantially modified, reduced or eliminated. By this means, the dynamics of the MEMS interface may be optimized and the undesirable negative spring constant may be substantially reduced or eliminated.

To achieve this benefit, terminal 47 is driven as follows. A feedback capacitor ($C_{fb}$) 61 is shown connected to the output of the amplifier 60 at one of its terminals and at an opposite one of its terminals, to the terminal 45. The amplifier 60 effectively converts the change in capacitance of the capacitor 50 to a change in voltage and provides the generated voltage to the inverter 91 and terminal 47 of the capacitor 81. Since the change in capacitance of the capacitor 50 is approximately proportional to the change in position 40, the voltage applied to terminal 47 is also proportional to the change in position 40. Each of the capacitors 61, 50, and 81 is a parallel-plate type of capacitors, thus, terminals 41, 43, 45, and 47 are commonly referred to as "plates".

The interface 11 of FIG. 1a, provides a feedback force to eliminate the position dependence of the net force and, consequently, the spring softening. Feedback capacitor ($C_f$) 81 having a terminal residing on the common mass 10 is used for this purpose. When the feedback gain is set for an exact cancellation of the position dependent force, the proposed circuit eliminates the spring softening. This condition also is equivalent to a constant charge operation, since the charge removed from the sense capacitor ($C_s$) 50 is replaced by charge placed on the feedback capacitor 81, resulting in zero change in the total charge on the MEMS device.

In FIG. 1a, a conceptual model of the interface 11 is shown at 13 where the effect of electrostatic forces acting across capacitors $C_s$ 50 and $C_f$ 81 are represented by two equivalent electrostatic springs $k_v$ 70 and $k_q$ 100. With reference to this model, the conditions for cancellation of the spring softening can be derived.

Spring $k_v$ 70 represents the position-dependent electrostatic force between the electrodes of capacitors $C_s$ 50 and $C_f$ 81, and its value is given by the following relationship:

$$k_v = -\frac{d^2(C_s + C_f)}{dx^2} \frac{V_b^2}{2}. \qquad \text{Eq. (6)}$$

Note that the spring constant, $k_v$ 70, is negative, which is indicative of electrostatic spring softening. Spring $k_q$ 100 represents the action of the feedback loop acting on the common mass 10 via the feedback capacitor $C_f$ 81, and its value is given by the following relationship:

$$k_q = \frac{1}{C_{fb}} \frac{dC_s}{dx} \frac{dC_f}{dx} V_b^2. \qquad \text{Eq. (7)}$$

Eliminating the position dependent force requires the following relationship between the capacitors 80 and 50:

$$C_{fb} = \frac{C_s C_f}{C_s + C_f},\qquad \text{Eq. (8)}$$

which also maintains a constant charge on the MEMS device. This particular condition creates a $k_q$ 100 that cancels $k_v$ 70. Thus, the interface 11 mitigates electrostatic spring softening in parallel-plate sense capacitors, such as the capacitors 50 and 81. It is also worth noting that the resonance frequency, $f_{res}$, of the system is now a function of $k_q$ as well, and can be expressed as:

$$f_{res} = \sqrt{\frac{k_x + k_v + k_q}{m}}.\qquad \text{Eq. (9)}$$

It should be noted that observing the relationship of Eq. (8) leads to substantial cancellation of the electrostatic spring softening, but it does not null the motion of the position common mass 10. Rather, it allows the position of the common mass 10 to vary normally in response to the applied force 17 in a manner as if there were essentially no electrostatic spring softening. This exemplary embodiment of the invention is different from position-nulling techniques known in the art in which a feedback network applies a force substantially equal to the applied force 17. In particular, known position-nulling techniques do not cancel spring softening. Furthermore, the foregoing embodiment of the invention does not null changes in position of the common mass 10. Position-nulling techniques balance the total applied force acting on the common mass 10, whereas the this embodiment eliminates dependence of the total force on position of the common mass 10. Accordingly, various disadvantages of position nulling (such as a need for high force transduction to null the total force and inverse dependence of the output signal of the amplifier 60 on the bias voltage, $V_b$ 80) are advantageously avoided by the various embodiments of the invention. It is also noted that position-nulling is not generally operable to provide fine tuning of the resonance frequency of the system, as would be indicated for the embodiment represented by Eq. (9). Rather, position-nulling is operable to significantly broaden the bandwidth of a MEMS system, in contrast to the various embodiments of the invention operable to fine tune the resonance frequency. Thus, the known technique of position-nulling by force feedback and the embodiments of the invention serve different purposes and have different functionality.

In alternative embodiments, the interface 11 can also be applied to non parallel-plate MEMS capacitors. For instance, a comb-based MEMS capacitor does not have spring softening. Thus, $k_v$ 70 is equal to 0 and $k_q$ 100 may be selected based on $C_{fb}$ 61 to provide a desired spring stiffness.

Figure 1B:
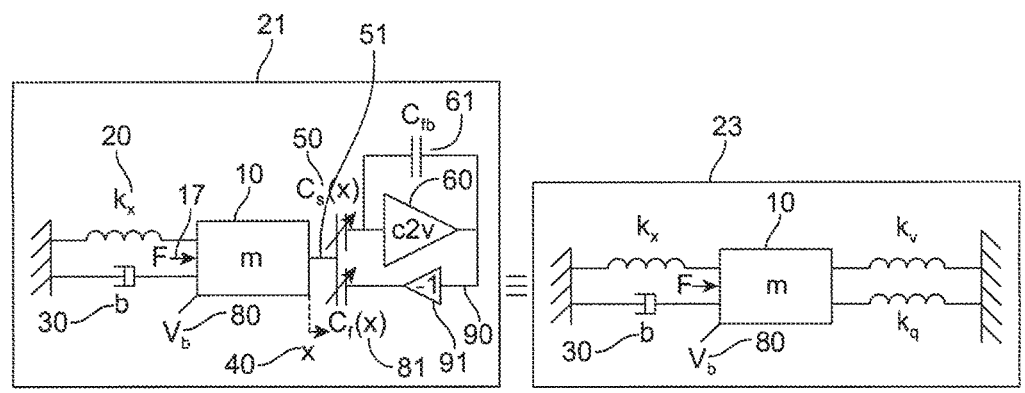
FIG. 1b shows a conceptual block diagram of a MEMS capacitive sensing interface 21, in accordance with another embodiment of the invention.

FIG. 1b shows a conceptual block diagram of a MEMS capacitive sensing interface 21, in accordance with another embodiment of the invention. A conceptual model of the interface 21 is shown at 23 and is analogous to that which is shown at 13, in FIG. 1a.

The interface 21 is analogous to the interface 11 except that the capacitors 50 and 81 are shown to be connected to a common terminal 51, which is also shown connected to the common mass 10. That is, the sense and feedback capacitors, $C_s(x)$ 50 and $C_f(x)$ 80 are implemented by splitting only the static electrode of the MEMS capacitor, as shown in FIG. 1b.

In the embodiments of FIGS. 1a and 1b, the electrostatic spring softening effect is reduced by measuring the change in the position 40 of the MEMS device, while the MEMS device is subjected to a position-dependent force associated with capacitors 50 and 81 and applying an additional force to the common mass 10 via capacitor 81 with the additional force being proportional to the measured change in position 40. The constant of proportionality is selected so that the net force has reduced dependence on the change in the position 40. In some embodiments, the two foregoing forces act in the same direction on the common mass 10 and in other embodiments, they act in opposite directions on the common mass 10.

Figure 1C:
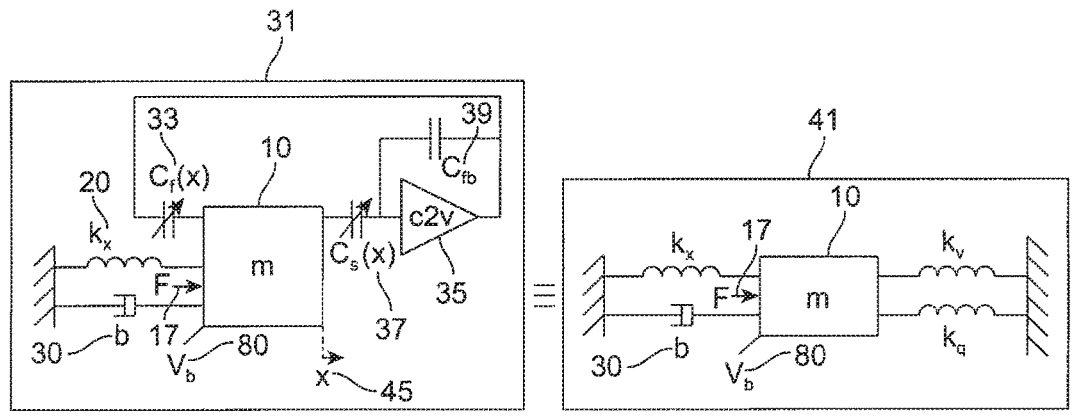
FIG. 1c shows a conceptual block diagram of a MEMS capacitive sensing interface 31, in accordance with another embodiment of the invention.

It is further possible further possible to have another embodiment where the sense and feedback capacitors are placed on opposite sides of the MEMS device, an example of which is shown in FIG. 1c. FIG. 1c shows a conceptual block diagram of a MEMS capacitive sensing interface 31, in accordance with another embodiment of the invention. A conceptual model of the interface 31 is shown at 41.

The interface 31 is analogous to that of FIGS. 1a and 1b except that the interface 31 lacks the inverter 91 and rather connects the output of the amplifier 35, which is analogous to the amplifier 60, to one of the terminals of the feedback capacitor 33 with an opposite terminal of the feedback capacitor 33 being connected to the common mass 10. The sense capacitor 37 is analogous to the capacitor 50 and the capacitor 39 is analogous to the capacitor 61.

The embodiment of FIG. 1c does not require the capacitors 37 and 33 to a have a common terminal. Such an implementation, however, will have multiple electrical nodes within the MEMS devices, one associated with each of capacitors 37 and 33. When sense and feedback capacitors are placed on opposite sides of the MEMS device, feedback loop no longer preserves constant charge on the MEMS device, even though it removes position dependence of the electrostatic force.

Figure 1D:
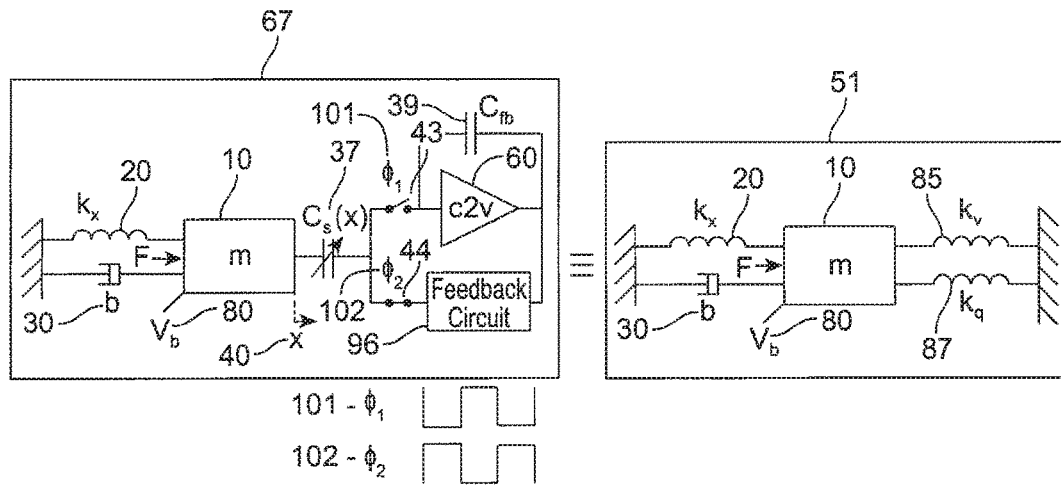
FIG. 1d shows a conceptual block diagram of a MEMS capacitive sensing interface 67, in accordance with another embodiment of the invention.

FIG. 1d shows a conceptual block diagram of a MEMS capacitive sensing interface 67, in accordance with another embodiment of the invention. A conceptual model of the interface 67 is shown at 51, in FIG. 1d. The interface 67 is analogous to the interface 21 except that it includes a feedback circuit 96 connected between the output of the amplifier 83 and one of the terminals of the capacitor 37, and a switches 43 and 44 are shown at the same terminal of the capacitor 37, with switch 43 coupled to the amplifier 83 and switch 44 coupled to the feedback circuit 96. The amplifier 83 is otherwise analogous to the amplifier 60.

In the interface 67, sense and feedback operations are separated by time division multiplexing. Such an implementation allows using the same sense capacitor, i.e. capacitor 37, for both position sensing and feedback. The sense circuit, made of the amplifier 83 and the capacitor 81 which is analogous to the capacitor 61, measures the value of capacitance in one phase $\phi_1$ 101, while the feedback circuit 96 applies feedback in the other phase $\phi_2$ 102.

Figure 2:
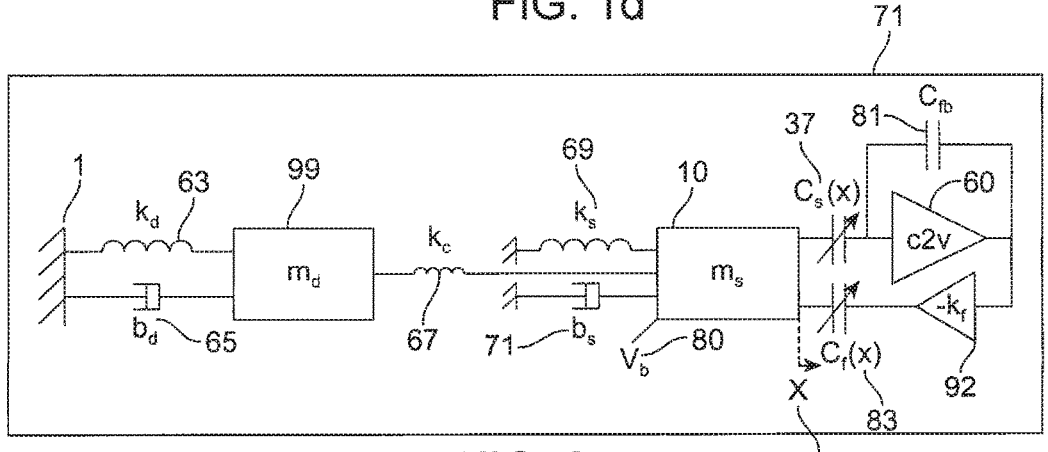
FIG. 2 shows a conceptual block diagram of a dual-mode MEMS system 71 using a sensing technique for tuning, in accordance with an embodiment and method of the invention.

The embodiments of FIGS. 1a-1d can introduce electrostatic spring stiffening via $k_q$ which can be used to offset the electrostatic spring softening of $k_v$. Introducing additional electrostatic spring softening via $k_q$ would also be possible by removing the inverter 91, shown in FIG. 1a, from the feedback loop. In alternative embodiments, such as shown in FIG. 2 and discussed below, both stiffening and softening allows the MEMS capacitance sensing interfaces of such embodiments to advantageously tune a resonance frequency of the MEMS device. Since this feature allows tuning of the mechanical resonance modes, it will be referred to as the "mode tuning" feature.

FIG. 2 shows a conceptual block diagram of an exemplary dual-mode MEMS system using a sensing technique for mode tuning, in accordance with an embodiment and method of the invention. In FIG. 2, a dual-mode MEMS system 71 is shown to include a spring 63, $k_d$, a damper 65, attached to the fixed structure 1 and to a mass 99 ($m_d$). The common mass 10 is shown to also be connected to a spring 67, $k_c$, which is shown connected to the mass 99. Common mass 10 also connects to spring 69, $k_s$, and to the damper 71, $b_s$, and further connected to the capacitor 37 and a feedback capacitor 83. The capacitor 83 is shown also connected to the output of a feedback gain $k_f$ 92, which receives its input from the capacitor 81 and the output of the amplifier 83. The capacitor 37 is connected to the capacitor 81 and the amplifier 83 much in the same manner as shown and discussed relative to FIG. 1d. In fact, the mass 10, spring 69, damper 71, capacitors 37, 83, 81, and amplifier 83 are analogous to those of their counterparts in FIG. 1d. The dampers in the model represent the effects of various energy loss mechanisms (such as air damping) on the behavior of the dual-mode MEMS device.

The common mass 10 is operated upon much in the same way as discussed hereinabove relative to FIG. 1a except that the resonance frequency of the common mass 10 is changed by changing the gain 92, which allows for this adjustable gain to better reduce and effectively cancel spring softening upon the common mass 10. Changing the gain 92 allows adjustment of the $k_q$ 100 term higher or lower than the inherent spring softening $k_v$ 70. By this means, the amplitude of the net electrostatic force is adjusted.

Mode tuning is particularly useful when the sense system resonance frequency is required to match a specific frequency, e.g. the mechanical resonance frequency of a drive system. As an example, in FIG. 2, the dual-mode transducer or MEMS system uses the transcapacitance amplifier 83 to tune the resonance frequency of the sense system to match the drive frequency by removing the spring softening and also compensating for manufacturing mismatch between the two. Tunability of $k_q$ 100 can be introduced, for example, by adjusting the gain $k_f$ 92. Such an implementation also has the advantage of decoupling frequency tuning from the transcapacitance gain of the sense circuit.

Figure 3:
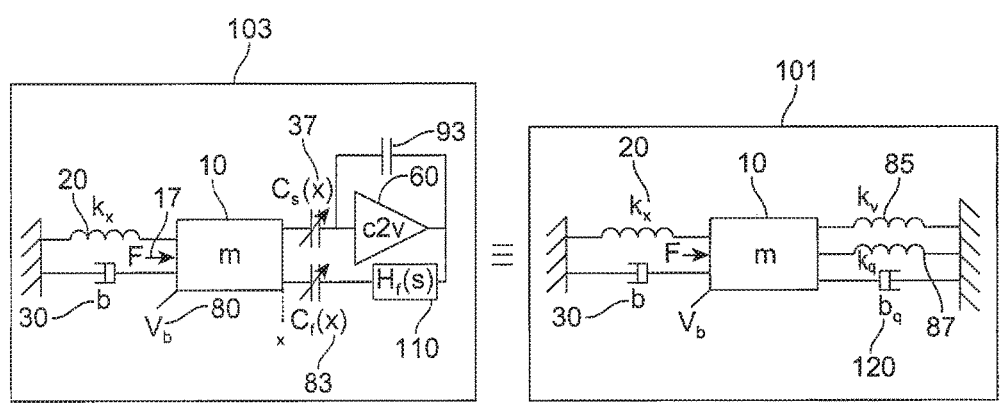
FIG. 3 shows a conceptual block diagram of a MEMS capacitive sensing interface 103, in accordance with an embodiment of the invention.

FIG. 3 shows a conceptual block diagram of a MEMS capacitive sensing interface 103, in accordance with an embodiment of the invention. Also shown in FIG. 3 is a conceptual model of the interface 103, at 101. The interface 93 is analogous to the interface 11 except that the inverter 91 is replaced with the signal conditioning circuit 110 having the effect of introducing a derivative term to the feedback. The use of a derivative term in the signal conditioning circuit 110 acts to modify the phase of the net electrostatic force. When the feedback loop of the embodiment of FIG. 3 is tuned for spring stiffening, the derivative term introduces additional damping $b_q$ 120 to MEMS dynamics, as follows:

$$F = m \cdot s^2 + b \cdot s + k_x + (1 + d \cdot s)k_q = m \cdot s^2 + (b + b_q)s + (k_x + k_q). \quad \text{Eq. (10)}$$

Since $b_q$ 120 is introduced by active electronics, its noise contribution is not directly related to the damping $b_q$ 120. Thus, compared to the dissipative means, i.e. air damping or resistive damping, active damping introduced by the proposed circuit can control the quality factor of the MEMS dynamics without a significant noise penalty. Such introduction of damping can be used, for example, to improve settling time of the MEMS system without sacrificing the noise performance.

Figure 4:
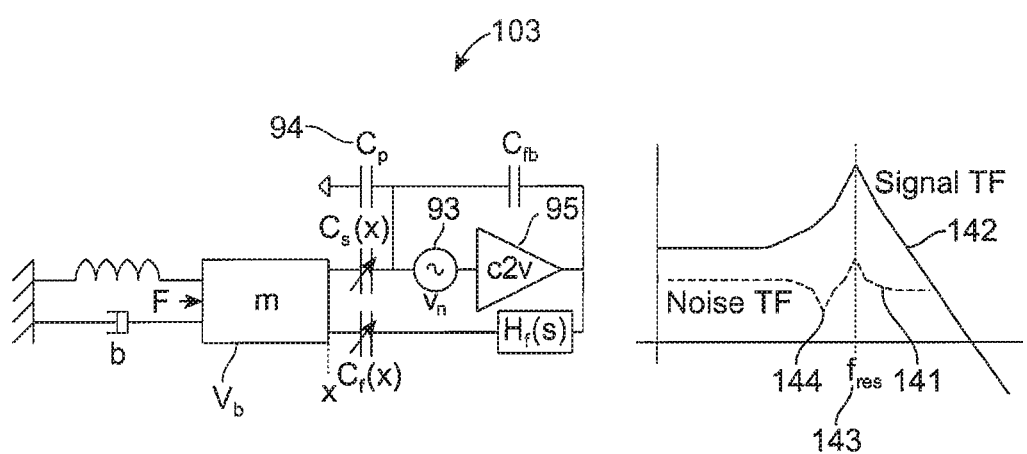
FIG. 4 shows a conceptual block diagram of the interface 103 with an added capacitor 94.

The interface 103 electronics include MEMS dynamics directly in its feedback path, thus, critical circuit parameters such as noise and stability directly depend on MEMS dynamics. The electronic noise generated in the capacitance sensing circuit is expected to be a significant noise source and can be modeled as a voltage source v. 93 at the input of the amplifier circuit as shown in FIG. 4. FIG. 4 shows a conceptual block diagram of the interface 103 but with an added parasitic capacitor 94. FIG. 4 further shows a graph of magnitude response vs. frequency of the noise- and signal-transfer functions associated with the interface of FIG. 4. The graph of FIG. 4 helps to show how the presence of MEMS dynamics affects the noise transfer function (NTF), at 141 to the output of the capacitance sensing circuit. Using small-signal force-balance equations for MEMS dynamics, it can be shown that the noise transfer function 141 of the system shown in FIG. 4 is, as follows:

$$NTF = \frac{C_p + C_s + C_{fb}}{C_{fb}} \frac{m \cdot s^2 + b \cdot s + k_x + k_v + \frac{C'_s}{C'_f} \frac{C_{fb}}{C_p + C_s + C_{fb}} k_q}{m \cdot s^2 + b \cdot s + k_x + k_v + k_q}, \quad \text{Eq. (11)}$$

where $C_s'$ and $C_f'$ represent first derivative of these capacitances with respect to the MEMS position.

Furthermore, the signal transfer function (STF) 142 can be written as a function of the transducer sensitivity ($S_{c2v}$) at the capacitance sensing circuit output and normalized MEMS dynamics:

$$STF = S_{c2v} \frac{k_x + k_v + k_q}{m \cdot s^2 + b \cdot s + k_x + k_v + k_q} \quad \text{Eq. (12)}$$

As seen in FIG. 4, both noise and signal are amplified by the mechanical resonance controlled by the constant charge sensing scheme. In other words, both STF and NTF have a peak around the resonance frequency $f_{res}$ 143 set by the feedback loop 90. The noise transfer function, however, also has an additional notch 144 at approximately the resonance frequency of MEMS without the feedback loop 90. In cases where the desired sense signal does not have to be at the exact sense resonance frequency $f_{res}$ 143, the noise notch 144 introduced by the feedback loop 90 can be exploited to significantly reduce the electronic noise contribution.

Having MEMS dynamics in the feedback loop of the interface electronics also constitute additional circuit requirements for stability. Both the transcapacitance feedback and charge replenishing feedback loops can be broken at the output of the amplifier 95. Loop gain analysis performed around the breaking point shows that MEMS dynamics create an additional Gain Margin requirement for the transcapacitance amplifier. As shown by the expected loop gain as follows:

$$T(s) = A(s) \frac{m \cdot s^2 + b \cdot s + k_x + k_v + k_q}{m \cdot s^2 + b \cdot s + k_x + k_v + \frac{C'_s}{C'_f} \frac{C_{fb}}{C_p + C_s + C_{fb}} k_q}, \quad \text{Eq. (13)}$$

where A(s) represents the open loop gain of the amplifier by itself, zeros of the loop gain are set by the dynamics under the influence of the constant charge sensing operation. Assuming the amplifier characteristics can be approximated by an integrator, complex zeros of the loop gain introduce the necessary phase shift for instability. Thus, having adequate gain margin (GM) around the resonance frequency $f_{res}$ is required for stability of the proposed circuit.

In accordance with the foregoing, electrostatic spring stiffening is provided thereby compensating for spring softening by using a second set of feedback capacitors to replenish the charge removed for sensing. Further, tuning of a resonance frequency of the MEMS device is performed, in accordance with various methods and embodiments of the invention.

The foregoing embodiments have been described in reference to single-ended circuit diagrams for the sake of clarity. It will be evident to one of ordinary skill that single-ended or differential embodiments are possible within the scope and spirit of the invention. The foregoing embodiments have also been described in reference to continuous-time circuit diagrams. It will be evident to one of ordinary skill that discrete-time embodiments are also possible within the scope and spirit of the invention.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A method of reducing electrostatic spring softening, comprising:
   measuring a change in position of a mass subjected to a first force depending on the change in position,
   applying a second force to the mass, the second force comprising a force proportional to the measured change in position, the constant of proportionality being selected so that the net force of the first and second forces has reduced dependence on the change in position.

2. The method of claim 1, wherein the dependence on the change in position is substantially eliminated.

3. The method of claim 1, wherein the first and second forces act in opposite directions on the mass.

4. The method of claim 1, further comprising the step of applying a high-voltage bias to the mass.

5. The method of claim 1, wherein the steps of measuring a change in position and applying a second force are time division multiplexed.

* * * * *